(12) United States Patent
Murakami et al.

(10) Patent No.: US 7,943,963 B2
(45) Date of Patent: May 17, 2011

(54) ORGANIC LIGHT-EMITTING DISPLAY DEVICE

(75) Inventors: Hajime Murakami, Tomobe (JP); Masao Shimizu, Hitachi (JP); Sukekazu Aratani, Hitachiota (JP); Etsuko Nishimura, Hitachiota (JP); Masahiro Tanaka, Chiba (JP)

(73) Assignee: Hitachi Displays, Ltd., Chiba (JP)

( * ) Notice: Subject to any disclaimer, the term of this patent is extended or adjusted under 35 U.S.C. 154(b) by 197 days.

(21) Appl. No.: 11/056,447

(22) Filed: Feb. 10, 2005

(65) Prior Publication Data

US 2005/0212003 A1    Sep. 29, 2005

(30) Foreign Application Priority Data

Mar. 24, 2004    (JP) .................. 2004-085897

(51) Int. Cl.
    *H01L 33/00*    (2010.01)
(52) U.S. Cl. ............ 257/189; 257/188; 257/79; 257/86; 257/87; 257/88; 257/E33.008
(58) Field of Classification Search .......... 257/98, 257/57, 59, 72, 257, 290, 351, 368, 10, 13, 257/292, 293, 79, 918, 188, 189, 86–89, 257/E33.008
    See application file for complete search history.

(56) References Cited

U.S. PATENT DOCUMENTS

| | | | |
|---|---|---|---|
| 5,496,597 A * | 3/1996 | Soininen et al. | 427/584 |
| 6,436,604 B1 * | 8/2002 | Bourdelais et al. | 430/256 |
| 6,489,638 B2 * | 12/2002 | Seo et al. | 257/98 |
| 6,733,591 B2 * | 5/2004 | Anderson | 118/715 |
| 6,787,249 B2 * | 9/2004 | Seo | 428/690 |
| 6,875,320 B2 * | 4/2005 | Raychaudhuri et al. | 204/192.12 |
| 6,951,694 B2 * | 10/2005 | Thompson et al. | 428/690 |
| 7,153,592 B2 * | 12/2006 | Yoshikawa | 428/690 |
| 7,291,973 B2 * | 11/2007 | Ishihara et al. | 313/505 |
| 7,619,244 B2 * | 11/2009 | Murakami et al. | 257/40 |

(Continued)

FOREIGN PATENT DOCUMENTS

JP    09063771 A    3/1997

(Continued)

OTHER PUBLICATIONS

Japanese language office action and its English language translation for corresponding Japanese application 2004085897 lists the references above.

*Primary Examiner* — Zandra Smith
*Assistant Examiner* — Tsz K Chiu
(74) *Attorney, Agent, or Firm* — Antonelli, Terry, Stout & Kraus, LLP.

(57) ABSTRACT

The present invention provides a top emission type organic light-emitting display device in a production of which it is possible to prevent the organic film from being oxidized when the upper transparent electrode is formed, and which is capable of emitting light at a low voltage. This organic light-emitting display device contains an organic light-emitting layer and an upper electrode and a lower electrode sandwiching the organic light-emitting layer, and is of a structure in which the emitted light is taken out from the upper electrode side, and a buffer layer mainly made of an oxide producing less oxygen by decomposition in the film-forming process than the upper electrode material is provided between the organic light-emitting layer and the upper electrode.

10 Claims, 3 Drawing Sheets

U.S. PATENT DOCUMENTS

| | | | |
|---|---|---|---|
| 2002/0030439 A1* | 3/2002 | Gurvitch et al. | 313/498 |
| 2002/0142189 A1* | 10/2002 | Seo | 428/690 |
| 2003/0048072 A1* | 3/2003 | Ishihara et al. | 313/506 |
| 2004/0113547 A1* | 6/2004 | Son et al. | 313/504 |
| 2004/0222737 A1* | 11/2004 | Raychaudhuri et al. | 313/504 |
| 2004/0263056 A1* | 12/2004 | Seo et al. | 313/500 |
| 2007/0170843 A1 | 7/2007 | Kawamura et al. | |

FOREIGN PATENT DOCUMENTS

| | | |
|---|---|---|
| JP | 2000021572 A | 1/2000 |
| JP | 2000-058265 | 2/2000 |
| JP | 2003272867 A | 9/2003 |
| WO | 9828767 A1 | 7/1998 |

* cited by examiner

| MATERIAL | NO BUFFER LAYER | ZnO | SnO$_2$ | WO$_3$ | MoO$_3$ | V$_2$O$_5$ |
|---|---|---|---|---|---|---|
| MELTING POINT (K) | | 2243 | 1903 | 1745 | 1074 | 943 |
| GIBBS FREE ENERGY AT MELTING POINT (kJ/mol) | | −123 | −192 | −382 | −468 | −1136 |
| RISE OF VOLTAGE (V) RELATIVE TO BOTTOM EMISSION STRUCTURE AT 100 cd/m$^2$ LIGHTING | 7.1 | 12 | 10 | 0.9 | 0.8 | 0.0 |

| FILM THICKNESS (nm) | NO BUFFER LAYER | 1 | 5 | 25 | 50 | 75 |
|---|---|---|---|---|---|---|
| CURRENT EFFICIENCY RATIO | 1 | 1.0 | 1.0 | 0.9 | 0.9 | 0.4 |
| CHANGE OF VOLTAGE (V) | 0 | −0.5 | −7.1 | −7.1 | −7.1 | −7.1 |

ORGANIC LIGHT-EMITTING DISPLAY DEVICE

FIELD OF THE INVENTION

The present invention relates to an organic light-emitting display device.

Recently, an attention has been focused on organic light-emitting display devices as next generation flat panel displays. Such organic light-emitting display devices have outstanding advantageous properties such as spontaneous light emission, wide viewing angle, and high response speed.

The conventional organic light-emitting elements are of a structure comprising, laminated on a glass substrate, a first electrode made of ITO or the like, organic layers comprising a hole transport layer, a light-emitting layer and an electron transport layer, and an upper electrode of a low work function. The emitted light passes through the first electrode which is transparent, and is taken out from a back side of a substrate side of the structure.

However, in the organic light-emitting display devices of the structure in which the emitted light is taken out from the back side of the substrate, in case of using an active matrix which has the advantages of higher definition and larger display size over a simple matrix, the aperture ratio is subject to limitation. Particularly in the large-size displays, in order to lessen variation of luminance between the pixels due to voltage drop of the power line, it is necessary to widen the power line, which leads to a substantial reduction of aperture ratio.

To overcome these problems, attempts have been made to make the upper electrode transparent and emit the light from the transparent upper electrode side.

For making the upper electrode transparent, its film is formed from an oxide mainly composed of indium oxide, such as ITO or IZO, by sputtering.

JP-A-2000-58265 (Patent Literature 1) discloses such a top emission type organic light-emitting element in which an organic cathode buffer layer is provided on a organic light-emitting structure as a protective layer against damage during high-energy cathode deposition.

BRIEF SUMMARY OF THE INVENTION

In the said top emission type organic light-emitting element, the layer interposed between the upper electrode and the organic film needs to be reduced in thickness because of the problem of low transmittance or low conductivity, and it is impossible to prevent the organic film from being oxidized when the upper electrode is formed, giving rise to the problem of elevated light emission voltage.

According to Patent Literature 1 mentioned above, although it is possible to protect the organic buffer layer from being damaged during high energy deposition, the buffer layer itself is oxidized when the upper electrode is formed, and the rise of light emission voltage is unavoidable.

An object of the present invention is to provide a top emission type organic light-emitting display device in a production of which it is possible to prevent the organic layers from being oxidized in the step of forming the upper transparent electrode and which is capable of emitting light at a low voltage.

In the present invention, in order to attain the above object, for instance the following means are incorporated.

An embodiment of the present invention is an organic light-emitting display device comprising;

an organic light-emitting layer;

an upper electrode and a lower electrode between which the said organic light-emitting layer is sandwiched, wherein a light emitted from the said organic light-emitting layer is taken out from the upper electrode side; and a buffer layer which is mainly composed of an oxide producing less oxygen by decomposition in the film forming process than the said upper electrode material and which is provided between the organic light-emitting layer and the upper electrode.

The organic light-emitting element comprises an electron injection layer, an electron transport layer, an organic light-emitting layer, an organic hole transport layer, a hole injection layer, an upper electrode and a lower electrode.

For the hole injection layer, materials having suitable ionization potentials are preferably used to reduce the injection barrier between the anode and the hole transport layer. Examples of such materials include, but are not limited to, copper phthalocyanines, star-burst amine compounds, polyanilines, and polythiophenes.

The hole transport layer functions to transport holes and inject them into the light-emitting layer. This hole transport layer, therefore, is preferably made of a material selected from those having high hole mobility, chemically stable and also high in glass transition temperature. Preferred examples of such materials include, but are not limited to, N,N'-bis(3-methylphenyl)-N,N'-diphenyl-[1,1'-biphenyl]-4,4'diamine (TPD), 4,4'-bis[N-(1-naphthyl)-N-phenylamino]biphenyl (α-NPD), 4,4',4"-tri(N-carbazolyl)triphenylamine (TCTA), and 1,3,5-tris[N-(4-diphenylaminophenyl)phenylamino] benzene (p-DPA-TDAB). Two or more of these materials may be used simultaneously.

The light-emitting layer is a layer where the injected holes and electrons recombine and which emits light at a wavelength intrinsic to the material of the layer. There are two cases of light emission. In one case, the host material comprising the light-emitting layer emits light. In another case, the dopant material added in a small quantity to the host emits light. As the heterothallic host materials, the following materials are preferably used: distylylarylene derivatives (DPVBi), silole derivatives with benzene skelton (2PSP), oxodiazole derivatives having a triphenylamine structure on both ends (EM2), perynone derivatives having phenanthrene groups (P1), oligothiophene derivatives having a triphenylamine structure on both ends (BMA-3T), perylene derivatives (tBu-PTC), tris(8-quinolinol) aluminum, poly-paraphenylene-vinylene derivatives, polythiophene derivatives, poly-paraphenylene derivatives, polysilane derivatives, and polyacetylene derivatives. The materials usable for this purpose are not limited to those listed above, and two or more of them can be used simultaneously.

As the dopant material, quinacridone, coumarin 6, Nile red, rubrene, 4-(dicyanomethylene)-2-methyl-6-(para-dimethylaminostyryl)-4H-pyran (DCM), and dicarbazole derivatives are preferably used. Of course the materials usable as dopant in this invention are not limited to those mentioned above, and two or more of these materials can be used simultaneously.

The electron transport layer functions to transport electrons and inject them into the light-emitting layer. Therefore, it preferably has a high electron mobility. Favorable materials of this layer are tris(8-quinolinol) aluminum, oxadiazole derivatives, silole derivatives, and zinc-benzothiazole complexes. Of course the usable materials are not limited to those mentioned above, and two or more of these materials can be used simultaneously.

The electron injection layer is intended to enhance the efficiency of electron injection from the cathode to the electron transport layer. It is preferably made of lithium fluoride, magnesium fluoride, calcium fluoride, strontium fluoride, barium fluoride, magnesium oxide or aluminum oxide. Of course the materials usable for this layer are not limited to those mentioned above, and two or more of them can be used simultaneously.

In the above-described structure, it is possible to dispense with the electron injection layer or the hole injection layer. The structure without the electron transport layer or the hole transport layer is also conceivable.

The "upper electrode" and the "lower electrode" refer to a pair of electrodes disposed sandwiching the organic light-emitting layer between them, of which the one positioned between the organic light-emitting layer and the substrate is designated lower electrode and the one disposed on the side opposite from the substrate is designated upper electrode.

The organic light-emitting element may take roughly the following two structures.

In one structure, the lower electrode functions as an anode and the upper electrode as a cathode. In this structure, a lower electrode, a hole injection layer, a hole transport layer, a light-emitting layer, an electron transport layer, an electron injection layer and an upper electrode are laminated in that order. The electron injection layer or the hole injection layer may be eliminated. It is also possible to exclude the electron transport layer or the hole transport layer.

Thus, the buffer layer may take the following three ways of arrangement: it is contacted with the organic light-emitting layer; it is contacted with the electron transport layer; or it is contacted with the electron injection layer.

The anode used as the lower electrode is preferably composed of a conductive film with a large work function for enhancing the hole injection efficiency. The materials usable for the anode include, but are not limited to, metals such as molybdenum, nickel and chromium, alloys of these metals, and inorganic materials such as polysilicon, amorphous silicon, tin oxides, and indium-tin oxides (ITO).

The $In_2O_3$—$SnO_2$ films assume a poly-crystalline state when they are deposited by sputtering with the substrate temperature elevated to about 200° C. Since the poly-crystalline state causes the different etching rates in the grains and the grain boundaries, the film is preferably of an amorphous state when it is used as the lower electrode.

In another structure, the lower electrode functions as a cathode and the upper electrode as an anode. This structure comprises a laminate of a lower electrode, an electron injection layer, an electron transport layer, a light-emitting layer, a hole transport layer, a hole injection layer and an upper electrode in that order. The above structure may be devoid of the electron injection layer or the hole injection layer. Also, it may not have the electron transport layer or the hole transport layer.

Thus, in this case, too, there are the following three ways of arrangement for the buffer layer: it is contacted with the organic light-emitting layer; it is contacted with the hole transport layer; or it is contacted with the hole injection layer.

As the cathode used as the lower electrode, a conductive film with a low work function is preferably used for enhancing the electron injection efficiency. Materials such as aluminum, aluminum-neodium alloy, magnesium-silver alloy, aluminum-lithium alloy, aluminum-calcium alloy, aluminum-magnesium alloy, metallic calcium and cerium compounds can be used for the cathode, but the materials usable therefor are not limited to those mentioned above.

The oxides having indium oxide as base can be mentioned as the materials usable for the upper electrode. The $In_2O_3$—$SnO_2$ and $In_2O_3$—$ZnO$ transparent conductive films are especially preferred. Various methods such as sputtering, opposing target type sputtering, EB evaporation and ion-plating are available for making these transparent conductive films.

In the upper electrode film forming operation, the oxide used as the upper electrode material is partially decomposed and the generated oxygen radicals act to oxidize the organic film to elevate the light emission voltage. As a result of close investigations, it was found that it is possible to curb the rise of light emission voltage caused by oxidation of the organic film in the upper electrode forming operation by providing between the organic film and the upper electrode a buffer layer mainly composed of a conductive oxide having a stronger oxygen bonding force than the upper electrode.

As the buffer layer mainly composed of a conductive oxide having a stronger oxygen bonding force than the upper electrode, in case of using an upper electrode mainly composed of, for instance, indium oxide, there can be used the materials mainly composed of vanadium oxide, molybdenum oxide, tungsten oxide, tantalum oxide, titanium oxide, niobium oxide, chromium oxide or the like. On the other hand, the materials mainly composed of germanium oxide, copper oxide, ruthenium oxide or the like are weaker in oxygen bonding force than indium oxide, so that there are produced a greater amount of oxygen radicals at the time of formation of the buffer layer than at the time of formation of the upper electrode film, making it impossible to hold down the rise of light emission voltage.

Another embodiment of the present invention is an organic light-emitting display device comprising:

an organic light-emitting layer;

an upper electrode and a lower electrode between which the organic light-emitting layer is sandwiched, wherein a light emitted from the organic light-emitting layer is taken out from the upper electrode side; and a buffer layer which is mainly composed of an oxide having a Gibbs free energy generated at a melting point being lower than Gibbs free energy of the upper electrode material and which is provided between the organic light-emitting layer and the upper electrode.

By using for the buffer layer a material which is lower in Gibbs free energy generated at the melting point than the base material of the upper electrode, it is possible to lessen the amount of oxygen radicals produced by decomposition before and in the initial phase of film forming, and to thereby suppress oxidation of the organic film.

Still another embodiment of the present invention provides an organic light-emitting display device comprising:

an organic light-emitting layer;

an upper electrode and a lower electrode between which the organic light-emitting layer is sandwiched, wherein a light emitted from the organic light-emitting layer is taken out from the upper electrode side; and a buffer layer which is mainly composed of an oxide having a Gibbs free energy generated at a melting point being lower than −300 kJ/mol and which is provided between the organic light-emitting layer and the upper electrode.

By using for the buffer layer a material having the melting-point Gibbs free energy being lower than 300 kJ/mol, it is possible to hold the rise of voltage below 1 V.

In yet another embodiment of the present invention, there is provided an active matrix type organic light-emitting display device comprising:

a plurality of pixels; and a thin film transistor for driving these pixels;

wherein each of said pixels has an organic light-emitting element comprising:
an organic light-emitting layer;
an upper electrode and a lower electrode between which the organic light-emitting layer is sandwiched, wherein a light emitted from the organic light-emitting layer is taken out from the upper electrode side and the upper electrode is connected to an auxiliary electrode; and
a buffer layer which is mainly composed of an oxide having a Gibbs free energy generated at a melting point being lower than −300 kJ/mol and which is provided between the organic light-emitting layer and the upper electrode.

Each circuit for actively driving the pixels usually consists of 2 to 4 pieces of thin film transistor (TFT) and capacitor, but the number of TFTs is not limited to 2 to 4; it is possible to provide more than 4 pieces of TFT in each circuit.

The term "pixel" used here signifies the minimum unit for displaying characters or graphics on a screen of a display device on which a plurality of such unit pixels are arranged vertically and horizontally.

In the case of a full-color display, usually each pixel consists of sub-pixels of three colors: green, red and blue.

Low-resistance materials such as aluminum, copper and their alloys are used for the auxiliary electrode, but the materials usable therefor are not limited to the above-mentioned.

In still another embodiment of the present invention, the upper electrode is a transparent electrode mainly composed of indium oxide.

Combination of the transparent electrode mainly composed of highly conductive indium oxide and the said buffer layer enables emission of light at a low voltage.

In yet another embodiment of the present invention, the said buffer layer is made of a material mainly composed of an oxide having a specific resistance of $1\times10^7$ Ω·cm or below and is 5 to 50 nm thick.

In case of using a material with a specific resistance of more than $1\times10^7$ Ω·cm for the buffer layer, there takes place 0.1 V or greater voltage drop in the buffer layer at the time of high luminance emission, which offsets the oxidation preventing effect. It is possible to inhibit oxidation of the organic film by making the film thickness 5 nm or greater, but if the film thickness is made more than 50 nm, the reduction of efficiency due to the drop of transmittance becomes unnegligible. The above structure is based on these facts.

In yet another embodiment of the present invention, the upper electrode is an anode, and the said buffer layer is mainly composed of an oxide of vanadium. By having the upper electrode serve as an anode and using an oxide of vanadium as the main constituent of the buffer layer, it is possible to substantially zero the rise of voltage. The composition of the oxide of vanadium is preferably the one in which the ratio of oxygen to vanadium is 2-5.

Provided as still another embodiment of the present invention is an active matrix type organic light-emitting display device comprising:
a plurality of pixels; and
a thin film transistor driving these pixels;
wherein each of said pixels has an organic light-emitting element which comprises:
an electron injection layer;
an electron transport layer;
an organic light-emitting layer;
an organic hole transport layer;
an upper electrode;
a lower electrode;
wherein a light emitted from the organic light-emitting layer is taken out from the upper electrode side; and
a buffer layer which is mainly composed of an oxide of vanadium and which is provided between the organic hole transport layer and the upper electrode.

By adapting the upper electrode to serve as an anode and using vanadium oxide for the buffer layer, since vanadium oxide is also capable of functioning as a hole transport layer, it is enabled to supply holes directly to the light-emitting layer without the organic hole transport layer and the organic hole injection layer.

In the present invention, a protective layer may be formed on the upper electrode to prevent $H_2O$ and $O_2$ in the atmosphere from penetrating into the upper electrode or the underlying organic layer.

The materials usable for the protective layer include, but are not limited to, the inorganic materials such as $SiO_2$, $SiN_X$, $SiO_XN_Y$ and $Al_2O_3$, and the organic materials such as polypropylene, polyethylene terephthalate, polyoxymethylene, polyvinyl chloride, polyvinylidene fluoride, cyanoethyl pullulan, polymethyl methacrylate, polysulfone, polycarbonate and polyimide.

Other objects, features and advantages of the invention will become apparent from the following description of the embodiments of the invention taken in conjunction with the accompanying drawings.

DESCRIPTION OF REFERENCE NUMERALS

105: lower capacitor electrode, 108: upper capacitor electrode, 109: signal line, 110: power line, 115: lower electrode, 116: substrate, 117: gate insulating film, 118: first insulating interlayer, 119: second insulating interlayer, 120: third insulating interlayer, 121: hole transport layer, 122: light-emitting layer, 123: electron transport layer, 124: electron injection layer, 125: upper electrode, 126: protective layer, 127: buffer layer, 128: auxiliary electrode, 129: hole injection layer.

DETAILED DESCRIPTION OF THE INVENTION

Examples of the present invention are illustrated below.

EXAMPLE 1

Figure 1:
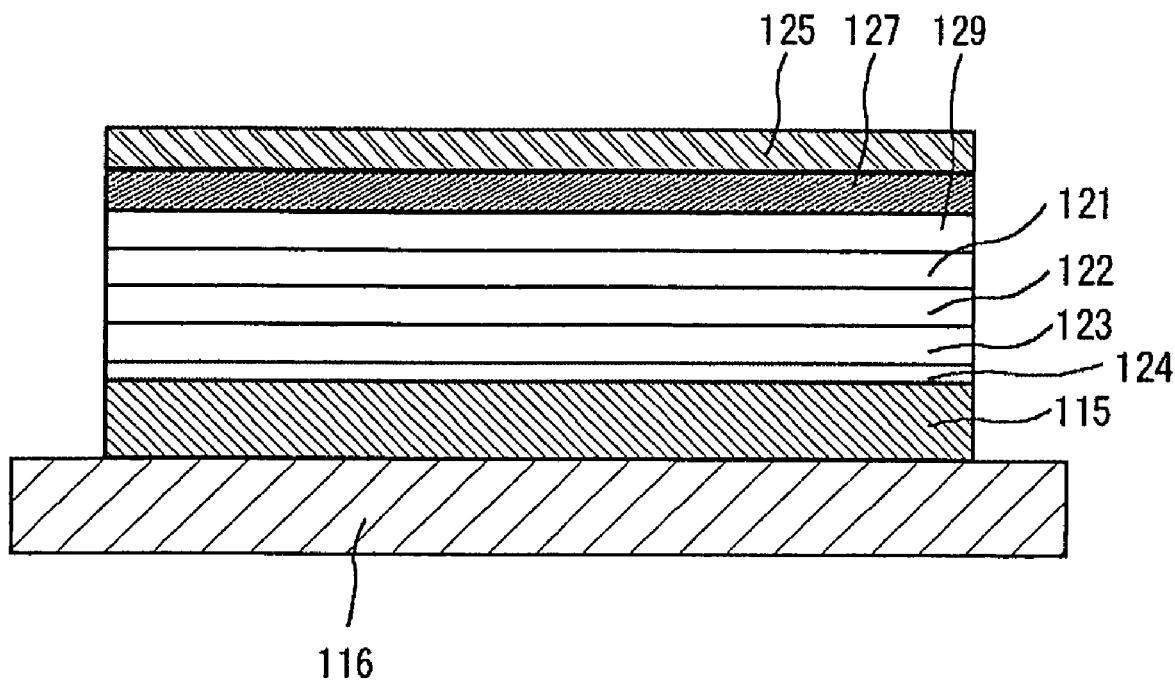
FIG. 1 is a sectional view of a pixel region in an organic light-emitting device shown in Example 1 of the present invention.

An example of organic light-emitting display device according to the present invention is explained below. FIG. 1 is a sectional view of the organic light-emitting display device according to Example 1 of the present invention. The lower electrode 115 comprises an Al film formed by EB deposition. The electrode film was patterned by using a shadow mask, and its thickness was 100 nm.

On the lower electrode 115 was formed a 0.5 nm thick LiF film as an electron injection layer 124 by vacuum deposition using a shadow mask for patterning.

On the electron injection layer 124, a film of tris(8-quinolinol) aluminum (hereinafter abbreviated as Alq), 20 nm thick, was formed by vacuum deposition. This Alq film functions as an electron transport layer 123. During the formation of the electron transport layer 123, a shadow mask was used to form its pattern. On the electron transport layer 123, a 20 nm thick co-deposition film of Alq and quinacridone (hereinafter abbreviated as Qc) was formed by two-source simultaneous vacuum deposition with the deposition rate controlled at 40:1. This co-deposition film of Alq and Qc serves as a light-emitting layer 122. Its pattern was formed using a shadow mask.

Then a film of 4,4-bis[N-(1-naphthyl)-N-phenylamino]biphenyl (hereinafter abbreviated as α-NPD) with a thickness of 50 nm was formed by vacuum deposition using a shadow mask for its patterning. The deposition region was 1.2 times each edge of the lower electrode. This α-NPD film works as a hole transport layer 121.

Then a film of copper phthalocyanine, 50 nm thick, was formed by vacuum deposition using a shadow mask for patterning. The deposition region was 1.2 times each edge of the lower electrode. This copper phthalocyanine film functions as a hole injection layer 129.

Figures 3, 4, 5:
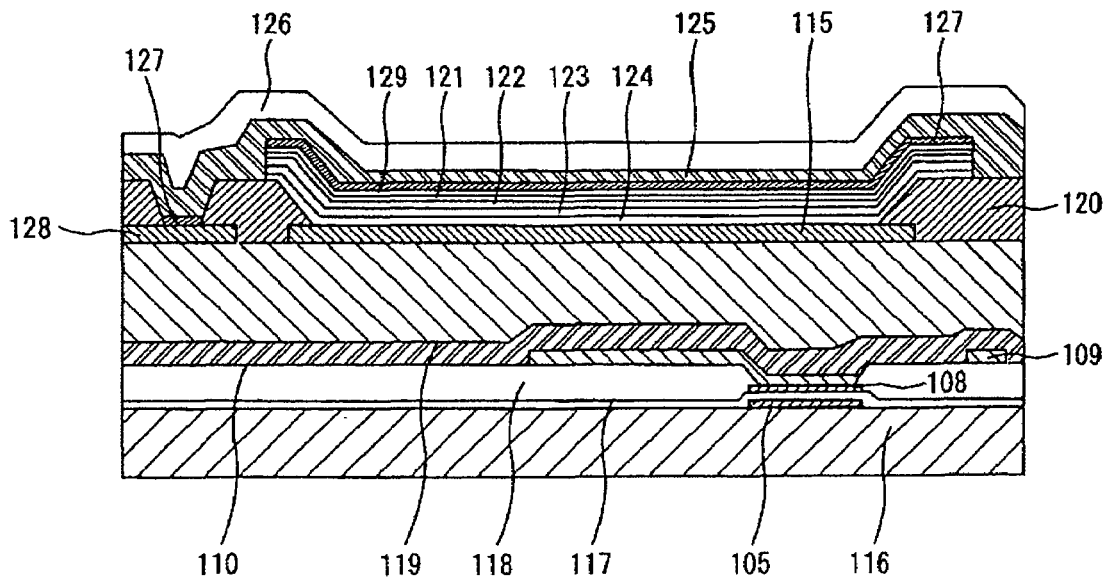
FIG. 3 is a table showing the rise of voltage, relative to the bottom emission type organic light-emitting device, at 100 cd/m² in the organic light-emitting device fabricated in Example 1 of the present invention.
FIG. 4 is a sectional view of a pixel region in the organic light-emitting device shown in Example 2 of the present invention.
FIG. 5 is a sectional view of a pixel region in the organic light-emitting device shown in Example 3 of the present invention.

A buffer layer 127 was formed by EB deposition of the materials shown in FIG. 3 using a shadow mask for its patterning. The buffer layer thickness was 15 nm in all the cases.

A 100 nm thick film of In—Zn—O (hereinafter abbreviated as IZO film) was formed by sputtering to serve as an upper electrode 125. This film is an amorphous oxide film. A target with a composition of In/(In+Zn)=0.83 was used for sputtering which was carried out in an Ar/$O_2$ mixed gas atmosphere under a vacuum pressure of 1 Pa at a sputtering output of 0.2 W/$cm^2$. The upper electrode 125 comprising this In—ZnO film serves as an anode with a transmittance of 80%.

Figure 2:
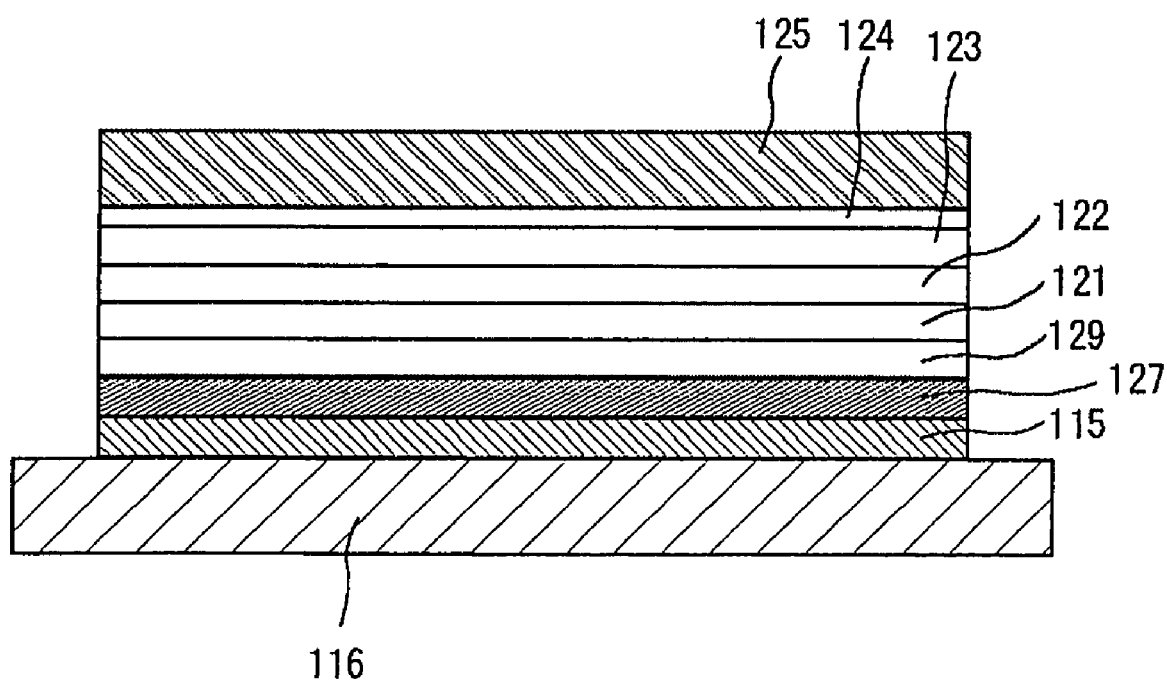
FIG. 2 is a sectional view of a bottom emission type organic light-emitting device made for the comparison with Example 1 of the present invention.

FIG. 2 illustrates a bottom emission type display device which was made to ensure the effect of the buffer layer. A In—Zn—O film (hereinafter abbreviated as IZO film), 100 nm thick, was formed by sputtering. This IZO film functions as a lower electrode 115 and is an amorphous oxide film. The same film forming conditions as employed in the example shown in FIG. 1 were used. On the lower electrode, a buffer layer 127, a hole injection layer 129, a hole transport layer 121, a light-emitting layer 122, an electron transport layer 123 and an electron injection layer 124 were laminated in this order. The materials of the respective layers, film forming conditions and film thickness were the same as in the example shown in FIG. 1. The upper electrode is an Al film formed by EB deposition using a shadow mask for its patterning. The film thickness was 100 nm. In this bottom emission type display device, since the upper electrode is a metallic electrode, there occurs no rise of light emission voltage due to oxidation of the organic film during formation of the upper electrode.

FIG. 3 shows the change of voltage with the respective buffer layer materials at 100 cd/$m^2$ light emission. The change of voltage is the difference from the bottom emission type display device made by using a same buffer layer material. In case a material having a stronger oxygen bonding force than indium oxides, with its Gibbs free energy generated at the melting point being lower than 300 kJ/mol, is used for the buffer layer, the rise of voltage is slight in comparison to the bottom emission type. In contrast, in case of using a material having a weaker bonding force with oxygen than indium oxides, with its Gibbs free energy generated at the melting point being higher than 300 kJ/mol, the light emission voltage rises up sharply as compared with the bottom emission type due to oxidation of the organic film. The Gibbs free energy mentioned here as a parameter of buffer layer material is, to be precise, decided by a value at around the melting point, but there is no problem if it is approximated by the value at the melting point.

EXAMPLE 2

Another example of organic light-emitting display device of the present invention is explained below. An organic light-emitting display device same as Example 1 in structure but different in thickness of the buffer layer was fabricated.

A film of vanadium oxide was formed as buffer layer 127 by EB deposition using a shadow mask for patterning. The film thickness was 1, 5, 25, 50 and 75 nm. A similar display device having no buffer layer was also made by way of comparison. The vanadium oxide film had a composition of V:O=1:2.45.

FIG. 4 shows the change of voltage and current efficiency ratio according to the buffer layer thickness at 100 cd/$m^2$ light emission. The change of voltage shown here is the one relative to the device having no buffer layer. Current efficiency ratio is the ratio to the current efficiency of the device having no buffer layer which is supposed to be 1.

If the buffer layer thickness is less than 5 nm, oxidation of the organic film can not be prevented, so the rise of light emission voltage can not be curbed. Also, a buffer layer thickness of greater than 50 nm leads to a reduction of transmittance, resulting in a lowered current efficiency. The definition of the buffer layer thickness in the range of 5 to 50 nm according to the present invention makes it possible to hold down the rise of voltage without lowering the current efficiency.

EXAMPLE 3

Still another example of the organic light-emitting display device according to the present invention will be explained. FIG. 5 is a sectional view of the organic light-emitting display device in the instant example of the present invention.

The organic light-emitting display device of this example is an active matrix type organic light-emitting display device comprising: a plurality of pixels; and a thin film transistor driving these pixels; wherein each of said pixels has an organic light-emitting element which comprises: an organic light-emitting layer; and an upper electrode and a lower electrode sandwiching the said organic light-emitting layer; wherein a light emitted from the organic light-emitting layer is taken out from the upper electrode side, said upper electrode is connected to an auxiliary electrode made of a low-resistance material, said organic light-emitting element has its constituent layers arranged in the order of lower electrode, organic light-emitting layer and upper electrode; and a buffer layer mainly composed of an oxide having a Gibbs free energy generated at a melting point being lower than 300 kJ/mol is provided between said organic light-emitting layer and said upper electrode and between said upper electrode and said auxiliary electrode.

A method of manufacturing the organic light-emitting display device of the instant example is explained below.

A film of amorphous silicon (a-Si), 50 nm thick, was formed on a glass substrate 116 by low pressure CVD (LPCVD). Then the whole surface of the a-Si film was laser-annealed, whereby the a-Si film was crystallized to form poly-crystalline Si (p-Si). Then the p-Si film was patterned by dry etching to form an active layer for the first transistor, an active layer for the second transistor, and a lower capacitor electrode 105.

Then a 100 nm thick $SiO_2$ film was formed as a gate insulating film 117 by plasma enhanced CVD (PECVD).

Further, a TiW film having a thickness of 50 nm was formed as a gate electrode by sputtering and patterned. Patterning was also conducted on the scanning line and the upper capacitor electrode 108.

Next, N ions were injected into the patterned p-Si layer from the top of the gate insulating film 117 by ion implantation. No N ions were injected to the region above which the gate electrode was present, thus forming an active region.

Then the glass substrate 116 was activated in an inert atmosphere of $N_2$ by heating so that the doping could be conducted effectively. On this substrate, a silicon nitride ($SiN_X$) film, 200 nm thick, was formed as a first insulating interlayer 118.

Then contact holes were formed in the gate insulating film 117 and the first insulating interlayer 118 on both ends of the active layer. Contact holes were also formed in the first insulating interlayer 118 on the gate electrode for the second transistor.

On the contact hole was formed a 500 nm thick Al film by sputtering, and a signal line 109 and a power line 110 were formed by a photolithographic process. There were also formed a source electrode and a drain electrode for the first transistor, and a source electrode and a drain electrode for the second transistor.

The lower capacitor electrode 105 and the drain electrode of the first transistor were connected. Also, the source electrode of the first transistor was connected to the signal line 109.

The drain electrode of the first transistor was connected to the gate electrode of the second transistor, and the drain electrode of the second transistor was connected to the power line 110. Further, the upper capacitor electrode 108 was connected to the power line 110.

A second insulating layer 119 of $SiN_X$ with a thickness of 500 nm was formed, and a contact hole was formed on top of the drain electrode of the second transistor. On the contact hole was formed a 150 nm thick Al film by sputtering, and a lower electrode 115 was formed by photolithograhy.

A positive type protective film of a light sensitive resin (PC452 produced by JSR Corp.) was formed as a third insulating interlayer 120 by spin coating and baked.

The third insulating interlayer 120 of PC452 was 1 μm thick and covered the edge of the lower electrode 115 by 3 μm.

The structure of the organic light-emitting element composing a pixel is explained with reference to FIG. 1. The glass substrate 116 having the lower electrode 115 formed thereon was subjected to ultrasonic cleaning with acetone and then with pure water, each for 3 minutes, and then spin dried.

On the lower electrode 115 was formed a LiF film, 0.5 nm thick, as an electron injection layer 124 by vacuum deposition using a shadow mask for forming a pattern. There was further formed thereon a 20 nm thick Alq film functioning as an electron transport layer 123 by vacuum deposition using a shadow mask for patterning. On this hole transport layer was formed a 20 nm thick co-deposition film of tris(8-quinolinol) aluminum (Alq) and quinacridone (Qc) by two-source simultaneous vacuum deposition, with the deposition rate controlled at Alq:Qc=40:1. This co-deposition film of Alq and Qc serves as a light-emitting layer 122. A shadow mask was used for its patterning.

Then a film of 4,4-bis[N-(1-naphthyl)-N-phenylamino]biphenyl (α-NPD), 50 nm thick, was formed by vacuum deposition using a shadow mask for forming its pattern. The deposition region was 1.2 times each edge of the lower electrode. This α-NPD film serves as a hole transport layer 121.

On the hole transport layer 121 was formed a 50 nm thick film of copper phthalocyanine by vacuum deposition using a shadow mask for patterning. The deposition region was 1.2 times each edge of the lower electrode. This copper phthalocyanine film functions as a hole injection layer 129.

Then a 15 nm thick vanadium oxide film was formed as a buffer layer 127 by EB deposition using a shadow mask for patterning. The film was formed on the light-emitting layer and the contact portion of the auxiliary electrode and the upper electrode. The vanadium oxide composition after deposition was vanadium:oxide=1:2.2, and the transmittance of the film was 95%.

Then a 100 nm thick film of In—Zn—O (IZO) was formed by sputtering. This IZO film serves as an upper electrode 125 and is amorphous. A target with a composition of In/(In+Zn)=0.83 was used. Sputtering was carried out in an $Ar/O_2$ mixed gas atmosphere under a vacuum pressure of 1 Pa at a sputtering output of 0.2 $W/cm^2$. The upper electrode 125 comprising the In—ZnO film serves as an anode. Its transmittance was 80%.

Then a film of $SiO_XN_Y$, 50 nm thick, was formed by sputtering to serve as a protective layer 126.

The organic light-emitting display device of this example can not only lessen the rise of light emission voltage but, as shown in FIG. 3, also enables low-resistance connection to the upper electrode without providing an additional contact layer on the auxiliary electrode.

EXAMPLE 4

Figure 6:
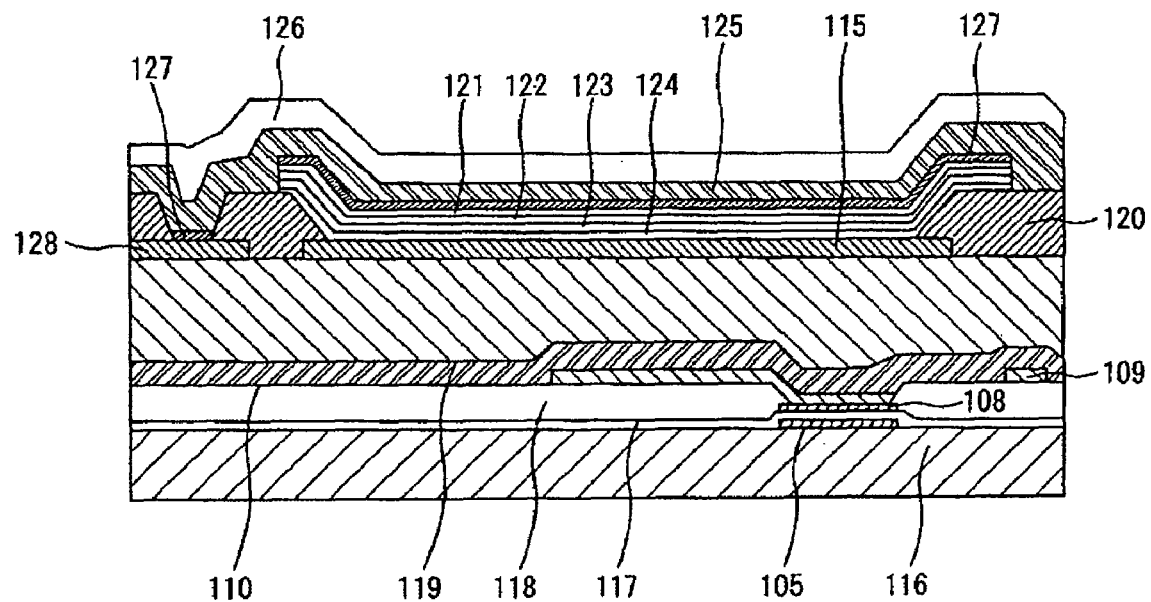
FIG. 6 is a sectional view of a pixel region in the organic light-emitting device shown in Example 4 of the present invention.

Still another example of organic light-emitting display device according to the present invention is explained with reference to FIG. 6 which shows a section of the device.

The organic light-emitting display device in this example is an active matrix type organic light-emitting display device comprising: a plurality of pixels; and a thin film transistor driving these pixels; each of said pixels having an organic light-emitting element which comprises: an electron injection layer; an electron transport layer; an organic light-emitting layer; an organic hole transport layer; an organic hole injection layer; an upper electrode; and a lower electrode; wherein a light emitted from the organic light-emitting layer is taken out from the upper electrode side; said organic light-emitting element having its constituent layers arranged in the order of the lower electrode, the electron injection layer, the electron transport layer, the organic light-emitting layer, the organic hole transport layer and the upper electrode; and a buffer layer mainly composed of an oxide of vanadium is provided between the said organic hole transport layer and the said upper electrode.

A method of manufacturing the organic light-emitting display device of this example is explained below.

A film of amorphous silicon (a-Si), 50 nm thick, was formed on a glass substrate 116 by low pressure CVD (LPCVD). Then the whole surface of the film was laser-annealed. The a-Si was crystallized thereby to become poly-crystalline silicon (p-Si). Then the p-Si film was patterned by dry etching to form an active layer for the first transistor, an active layer for the second transistor and a lower capacitor electrode 105.

Then a gate insulating film 117 of $SiO_2$ with a thickness of 100 nm was formed by plasma enhanced CVD (PECVD).

Then a gate electrode of TiW, 50 nm thick, was formed by sputtering and patterned. A scanning line and an upper capacitor electrode 108 were also patterned simultaneously.

N ions were injected into the patterned p-Si layer from the top of the gate insulating film 117 by ion implantation. No N ions were injected to the region above which the gate electrode was present, thereby forming an active region.

Then the glass substrate 116 was activated in an inert $N_2$ atmosphere by heating so that the doping could be conducted effectively. On the glass substrate 116 was formed a first insulating interlayer 118 of silicon nitride ($SiN_X$), 200 nm thick.

Next, contact holes were formed in the gate insulating film 117 and the first insulating interlayer 118 on both ends of the active layer. A contact hole was also formed in the first insulating interlayer 118 on the upper side of the gate electrode of the second transistor.

A 500 nm thick Al film was formed thereon by sputtering, and a signal line 109 and a power line 110 were formed by photolithography. There were also formed a source electrode and a drain electrode for the first transistor, and a source electrode and a drain electrode for the second transistor.

The lower capacitor electrode 105 and the drain electrode of the first transistor were connected, and the source electrode of the first transistor was connected to the signal line 109.

Also, the drain electrode of the first transistor was connected to the gate electrode of the second transistor, and the drain electrode of the second transistor was connected to the power line 110. The upper capacitor electrode 108 was also connected to the power line 110.

Then a second insulating interlayer 119 of $SiN_X$ with a thickness of 500 nm was formed, and a contact hole was formed on top of the drain electrode of the second transistor. On this contact hole was formed a 150 nm thick Al film by sputtering, and a lower electrode 115 was formed by photolithography.

Then a positive type protective film of a light sensitive resin (PC452 produced by JSR Corp.) was formed by spin coating as a third insulating interlayer 120 and baked.

This third insulating interlayer film 120 was 1 μm thick and covered the edge of the lower electrode 115 by 3 μm.

The structure of the organic light-emitting element serving as a pixel is explained with reference to FIG. 1. The glass substrate 116 having the lower electrode 115 thereon was subjected to ultrasonic cleaning with acetone and then with pure water, each for three minutes, and then spin-dried.

On the lower electrode 115 was formed a LiF film, 0.5 nm thick, as an electron injection layer 124 by vacuum deposition using a shadow mask for forming a pattern. There was further formed thereon a 20 nm thick Alq film functioning as an electron transport layer 123 by vacuum deposition using a shadow mask for patterning. On this hole transport layer was formed a 20 nm thick co-deposition film of tris(8-quinolinol) aluminum (Alq) and quinacridone (Qc) by two-source simultaneous vacuum deposition, with the deposition rate controlled at Alq:Qc=40:1. This co-deposition film of Alq and Qc serves as a light-emitting layer 122. A shadow mask was used for its patterning.

Then, a film of 4,4-bis[N-(1-naphthyl)-N-phenylamino] biphenyl (α-NPD), 50 nm thick, was formed by vacuum deposition using a shadow mask for forming its pattern. The deposition region was 1.2 times each edge of the lower electrode. This α-NPD film serves as a hole transport layer 121.

Then a 15 nm thick vanadium oxide film was formed as a buffer layer 127 by EB deposition using a shadow mask for patterning. The film was formed on the light-emitting layer and the contact portion of the auxiliary electrode and the upper electrode. The vanadium oxide composition after deposition was vanadium:oxide=1:2.2, and the transmittance of the film was 90%.

Then a 100 nm thick film of In—Zn—O (IZO) was formed by sputtering. This IZO film serves as an upper electrode 125 and is amorphous. A target with a composition of In/(In +Zn)=0.83 was used. Sputtering was carried out in an $Ar/O_2$ mixed gas atmosphere under a vacuum pressure of 1 Pa at a sputtering output of 0.2 $W/cm^2$. The upper electrode 125 comprising the In—ZnO film serves as an anode. Its transmittance was 80%.

Then a film of $SiO_XN_Y$, 50 nm thick, was formed by sputtering to serve as a protective layer 126.

The organic light-emitting display device of this example could emit light efficiently without the hole injection layer, and the voltage at 100 $cd/m^2$ emission lowered by 0.2 V in comparison with Example 2.

EXAMPLE 5

Figure 7:
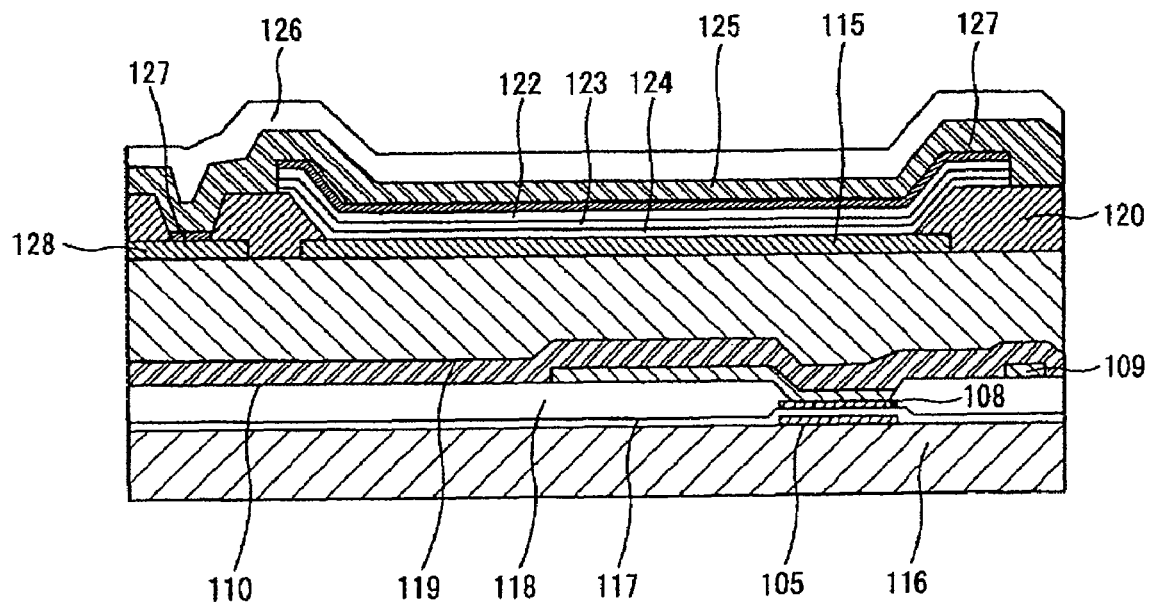
FIG. 7 is a sectional view of a pixel region in the organic light-emitting device shown in Example 5 of the present invention.

Yet another example of organic light-emitting display device according to the present invention is explained. FIG. 7 is a sectional view of the organic light-emitting display device of this example.

The organic light-emitting display device in this example is an active matrix type organic light-emitting display device comprising: a plurality of pixels; and a thin film transistor driving these pixels; each of said pixels having an organic light-emitting element which comprises: an electron injection layer; an electron transport layer; an organic light-emitting layer; an organic hole transport layer; an upper electrode; and a lower electrode; wherein a light emitted from the organic light-emitting layer is taken out from the upper electrode side; said organic light-emitting element having its constituent layers arranged in the order of the lower electrode, the electron injection layer, the electron transport layer, the organic light-emitting layer, the organic hole transport layer and the upper electrode; and a buffer layer mainly composed of an oxide of vanadium is provided between the said organic hole transport layer and the said upper electrode.

A method of manufacturing the organic light-emitting display device of this example is explained below.

A film of amorphous silicon (a-Si), 50 nm thick, was formed on a glass substrate 116 by low pressure CVD (LPCVD). Then the whole surface of the film was laser-annealed. The a-Si was crystallized thereby to become polycrystalline silicon (p-Si). Then the p-Si film was patterned by dry etching to form an active layer for the first transistor, an active layer for the second transistor and a lower capacitor electrode 105.

Then a gate insulating film 117 of $SiO_2$ with a thickness of 100 nm was formed by plasma enhanced CVD (PECVD).

Then a gate electrode of TiW, 50 nm thick, was formed by sputtering and patterned. A scanning line and an upper capacitor electrode 108 were also patterned simultaneously.

N ions were injected into the patterned p-Si layer from the top of the gate insulating film 117 by ion implantation. No N ions were injected to the region above which the gate electrode was present, thereby forming an active region.

Then the glass substrate 116 was activated in an inert $N_2$ atmosphere by heating so that the doping could be conducted effectively. On the glass substrate 116 was formed a first insulating interlayer 118 of silicon nitride ($SiN_X$), 200 nm thick.

Next, contact holes were formed in the gate insulating film 117 and the first insulating interlayer 118 on both ends of the active layer. A contact hole was also formed in the first insulating interlayer 118 on the upper side of the gate electrode of the second transistor.

A 500 nm thick Al film was formed thereon by sputtering, and a signal line 109 and a power line 110 were formed by photolithography. There were also formed a source electrode and a drain electrode for the first transistor, and a source electrode and a drain electrode for the second transistor.

The lower capacitor electrode 105 and the drain electrode of the first transistor were connected, and the source electrode of the first transistor was connected to the signal line 109.

Also, the drain electrode of the first transistor was connected to the gate electrode of the second transistor, and the drain electrode of the second transistor was connected to the power line 110. The upper capacitor electrode 108 was also connected to the power line 110.

Then a second insulating interlayer 119 of $SiN_X$ with a thickness of 500 nm was formed, and a contact hole was formed on top of the drain electrode of the second transistor. On this contact hole was formed a 150 nm thick Al film by sputtering, and a lower electrode 115 was formed by photolithography.

Then a positive type protective film of a light sensitive resin (PC452 produced by JSR Corp.) was formed by spin coating as a third insulating interlayer 120 and baked.

This third insulating interlayer film 120 was 1 μm thick and covered the edge of the lower electrode 115 by 3 μm.

The structure of the organic light-emitting element serving as a pixel is explained with reference to FIG. 1. The glass substrate 116 having the lower electrode 115 thereon was subjected to ultrasonic cleaning with acetone and then with pure water, each for three minutes, and then spin-dried.

On the lower electrode 115 was formed a LiF film, 0.5 nm thick, as an electron injection layer 124 by vacuum deposition using a shadow mask for forming a pattern. There was further formed thereon a 20 nm thick Alq film functioning as an electron transport layer 123 by vacuum deposition using a shadow mask for patterning. On this holetransport layer was formed a 20 nm thick co-deposition film of tris(8-quinolinol) aluminum (Alq) and quinacridone (Qc) by two-source simultaneous vacuum deposition, with the deposition rate controlled at Alq:Qc=40:1. This co-deposition film of Alq and Qc serves as a light-emitting layer 122. A shadow mask was used for its patterning.

Then a 15 nm thick vanadium oxide film was formed as a buffer layer 127 by EB deposition using a shadow mask for patterning. The film was formed on the light-emitting layer. The vanadium oxide composition after deposition was vanadium:oxide=1:2.2, and the transmittance of the film was 95%.

Then a 100 nm thick film of In—Zn—O (IZO) was formed by sputtering. This IZO film serves as an upper electrode 125 and is amorphous. A target with a composition of In/(In+Zn)=0.83 was used. Sputtering was carried out in an $Ar/O_2$ mixed gas atmosphere under a vacuum pressure of 1 Pa at a sputtering output of 0.2 $W/cm^2$. The upper electrode 125 comprising the In—ZnO film serves as an anode. Its transmittance was 80%.

Then a film of $SiO_XN_Y$, 50 nm thick, was formed by sputtering to serve as a protective layer 126.

The organic light-emitting display device of this example could emit light efficiently without the hole injection layer, and the voltage at 100 $cd/m^2$ emission lowered by 0.4 V in comparison with Example 2.

By using the present invention, it is possible to realize a high-efficiency spontaneously light-emitting thin display device. The invention also finds utilization for various types of display devices such as television and information terminals.

It should be further understood by those skilled in the art that although the foregoing description has been made on embodiments of the invention, the invention is not limited thereto and various changes and modifications may be made without departing from the spirit of the invention and the scope of the appended claims.

ADVANTAGE OF THE INVENTION

In the display device according to the present invention, it is possible to lessen oxidation of the organic film when the upper electrode is formed, and to curb the rise of light emission voltage which has been seen in the conventional structures.

The invention claimed is:

1. An organic light-emitting display device comprising:
an organic light-emitting layer;
an upper electrode and a lower electrode between which the organic light-emitting layer is sandwiched, wherein a light emitted from the organic light-emitting layer is taken out from the upper electrode side; and
an insulating film covering an edge of the lower electrode, wherein
the organic light-emitting layer and a buffer layer are formed on the insulating film,
said buffer layer is mainly composed of an oxide having a Gibbs free energy generated at a melting point being lower than Gibbs free energy of the upper electrode material,
said buffer layer comprises at least one component selected from the group consisting of an oxide of vanadium, an oxide of tungsten and an oxide of molybdenum,
said buffer layer is provided between said organic light-emitting layer and said upper electrode, and
the upper electrode is a transparent electrode of an oxide.

2. The organic light-emitting display device according to claim 1, wherein
said upper electrode is connected to an auxiliary electrode; and
said buffer layer is provided between said upper electrode and said auxiliary electrode.

3. The organic light-emitting display device according to claim 2, wherein said upper electrode is connected to said auxiliary electrode at the buffer layer.

4. An organic light-emitting display device comprising:
an organic light-emitting layer;
an upper electrode and a lower electrode between which the organic light-emitting layer is sandwiched, wherein a light emitted from the organic light-emitting layer is taken out from the upper electrode side; and
an insulating film covering an edge of the lower electrode, wherein
the organic light-emitting layer and a buffer layer are formed on the insulating film,
said buffer layer is mainly composed of an oxide having a Gibbs free energy generated at a melting point being lower than −300 kJ/mol, said buffer layer comprises at least one component selected from the group consisting of an oxide of vanadium, an oxide of tungsten and an oxide of molybdenum, said buffer layer is provided between said organic light-emitting layer and said upper electrode, and the upper electrode is a transparent electrode of an oxide.

5. The organic light-emitting display device according to claim 4, wherein said upper electrode is connected to an auxiliary electrode; and said buffer layer is provided between said upper electrode and said auxiliary electrode.

6. An active matrix type organic light-emitting display device comprising:

a plurality of pixels; and a thin film transistor for driving these pixels;

wherein each of said pixels has an organic light-emitting element comprising:

an organic light-emitting layer; and an upper electrode and a lower electrode between which the organic light-emitting layer is sandwiched, wherein a light emitted from the organic light-emitting layer is taken out from the upper electrode side, an insulating film covers an edge of the lower electrode, the organic light-emitting layer and a buffer layer are formed on the insulating film, said buffer layer is mainly composed of an oxide having a Gibbs free energy generated at a melting point being lower than −300 kJ/mol, said buffer layer comprises at least one component selected from the group consisting of an oxide of vanadium, an oxide of tungsten and an oxide of molybdenum, said buffer layer is provided between said organic light-emitting layer and said upper electrode, and the upper electrode is a transparent electrode of an oxide.

7. The active matrix type organic light-emitting display device according to claim 6, wherein said upper electrode is connected to an auxiliary electrode; and said buffer layer is provided between said upper electrode and said auxiliary electrode.

8. The organic light-emitting display device according to claim 1, 4 or 6 wherein the buffer layer comprises at least one component selected from the group consisting of an oxide of vanadium, an oxide of tungsten and an oxide of molybdenum.

9. An active matrix type organic light-emitting display device comprising:

a plurality of pixels; and a thin film transistor driving these pixels;

wherein each of said pixels has an organic light-emitting element which comprises:

an electron injection layer;

an electron transport layer;

an organic light-emitting layer;

an organic hole transport layer;

an upper electrode; and a lower electrode; wherein a light emitted from the organic light-emitting layer is taken out from the upper electrode side, an insulating film covers an edge of the lower electrode, the organic light-emitting layer and a buffer layer are formed on the insulating film, said buffer layer comprises at least one component selected from the group consisting of an oxide of vanadium, an oxide of tungsten and an oxide of molybdenum, said buffer layer is provided between said organic light-emitting layer and said upper electrode, and the upper electrode is a transparent electrode of an oxide.

10. The active matrix type organic light-emitting display device according to claim 9, wherein said upper electrode is connected to an auxiliary electrode; and said buffer layer is provided between said upper electrode and said auxiliary electrode.

\* \* \* \* \*